(12) United States Patent
Pavlichin et al.

(10) Patent No.: US 11,966,597 B1
(45) Date of Patent: Apr. 23, 2024

(54) MULTI-DOMAIN CONFIGURABLE DATA COMPRESSOR/DE-COMPRESSOR

(71) Applicant: Amazon Technologies, Inc., Seattle, WA (US)

(72) Inventors: Dmitri Pavlichin, Redwood City, CA (US); Shubham Chandak, Palo Alto, CA (US); Itschak Weissman, Stanford, CA (US); Christopher George Burgess, Charlotte, NC (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 17/936,765

(22) Filed: Sep. 29, 2022

(51) Int. Cl.
*G06F 3/06* (2006.01)

(52) U.S. Cl.
CPC .......... *G06F 3/0626* (2013.01); *G06F 3/0631* (2013.01); *G06F 3/0673* (2013.01)

(58) Field of Classification Search
CPC ..... G06F 3/0626; G06F 3/0631; G06F 3/0673
See application file for complete search history.

(56) References Cited

U.S. PATENT DOCUMENTS

| | | |
|---|---|---|
| 6,170,047 B1 | 1/2001 | Dye |
| 6,310,973 B1 | 10/2001 | Persiantsev et al. |
| 6,310,978 B1 | 10/2001 | Persiantsev |
| 9,384,204 B2 | 7/2016 | Gupta |
| 9,767,098 B2 | 9/2017 | Patiejunas |
| 10,089,023 B2 | 10/2018 | Malina |
| 10,359,960 B1 | 7/2019 | Alshawabkeh |
| 10,732,902 B1* | 8/2020 | Lazier ................. G06F 16/2228 |
| 11,507,324 B2 | 11/2022 | Lazier et al. |
| 2011/0055441 A1* | 3/2011 | Uchiyama ............ H04N 19/134 710/68 |
| 2011/0103491 A1 | 5/2011 | Saes et al. |
| 2014/0237201 A1 | 8/2014 | Swift |
| 2014/0289376 A1 | 9/2014 | Chan |
| 2014/0351229 A1 | 11/2014 | Gupta |
| 2015/0280736 A1* | 10/2015 | Ogasawara ............. H03M 7/42 341/51 |
| 2015/0331621 A1* | 11/2015 | Slik ....................... G06F 3/0683 711/114 |

(Continued)

OTHER PUBLICATIONS

AWS, "Announcing S3 Intelligent-Tiering—A New Amazon S3 Storage Class", Retrieved from https://aws.amazon.com/about-aws/whats-new/2018/11/s3-intelligent-tiering/ on Sep. 29, 2020, Posted Nov. 25, 2018, pp. 1-2.

(Continued)

*Primary Examiner* — Edward J Dudek, Jr.
(74) *Attorney, Agent, or Firm* — Alexander A. Knapp; Kowert, Hood, Munyon, Rankin & Goetzel, P.C.

(57) ABSTRACT

A data service implements a configurable data compressor/decompressor using a recipe generated for a particular data set type and using compression operators of a common registry (e.g., pantry) that are referenced by the recipe, wherein the recipe indicates at which nodes of a compression graph respective ones of the compression operators of the registry are to be implemented. The configurable data compressor/decompressor provides a customizable framework for compressing data sets of different types (e.g., belonging to different data domains) using a common compressor/decompressor implemented using a common set of compression operators.

20 Claims, 12 Drawing Sheets

(56) References Cited

U.S. PATENT DOCUMENTS

| | | |
|---|---|---|
| 2016/0321287 A1 | 11/2016 | Luthra |
| 2017/0054611 A1 | 2/2017 | Tiell |
| 2017/0090776 A1 | 3/2017 | Kowles |
| 2017/0102961 A1 | 4/2017 | Hilemon |
| 2018/0024752 A1 | 1/2018 | Miller |
| 2018/0203636 A1 | 7/2018 | Pulipaka |
| 2018/0219737 A1 | 8/2018 | Schulz |
| 2018/0322040 A1 | 11/2018 | Nikoloudakis |
| 2019/0235758 A1 | 8/2019 | Constantinescu |
| 2019/0310919 A1 | 10/2019 | Natanzon |
| 2020/0082103 A1 | 3/2020 | Heidinga |
| 2020/0192572 A1 | 6/2020 | Dwarampudi |
| 2020/0249877 A1 | 8/2020 | Mcilroy |
| 2020/0272566 A1 | 8/2020 | Saeki |
| 2020/0284883 A1 | 9/2020 | Ferreira |
| 2020/0348948 A1* | 11/2020 | Chamberlain .... G06F 16/90335 |
| 2022/0129190 A1* | 4/2022 | Bassov ................... G06F 3/067 |
| 2022/0382717 A1* | 12/2022 | Zhang .................... G06N 20/00 |
| 2023/0089082 A1* | 3/2023 | Schreter ................ G06F 16/221 |
| | | 341/51 |

OTHER PUBLICATIONS

Jeff Barr, "New—Automatic Cost Optimization for Amazon S3 via Intelligent Tiering", AWS News Blog, Retrieved from https://aws.amazon.com/blogs/aws/new-automatic-cost-optimization-for-amazon-s3-via-intelligent-tiering/ on Sep. 29, 2020, Posted on Nov. 26, 2018, pp. 1-5.

U.S. Appl. No. 17/039,938, filed Sep. 30, 2020, Bartenstein, et al.

\* cited by examiner

Compression Recipe Generation Module
152

Offline Training to Determine Recipes for Data Set Types
202

Online Training to Determine Recipes for Data Set Types
204

Hybrid Training to Determine Recipes for Data Set Types
206

User Provided Constraints and/or Optimization Goals Storage for Use in Offline, Online, or Hybrid Training
208

MULTI-DOMAIN CONFIGURABLE DATA COMPRESSOR/DE-COMPRESSOR

BACKGROUND

Data compression can be used to reduce a number of bits required to store or communicate data. Data compression algorithms are often developed with a particular data domain in mind. For example, a first type of compression algorithm may be designed to compress data from a first domain, such as general textual data, while another type of compression algorithm may be designed to compress data from another domain, such as log data. Such domain specific compression algorithms often take advantage of redundancies in how information is structured in a given domain to achieve good compression performance for data of the given domain. However, a domain specific compression algorithm designed for a first domain may not function well if used to compress data having a different structure corresponding to a different domain.

Also, maintaining several different compression algorithms for a large number of data domains may be resource and cost intensive. For example, updates may need to be managed for multiple compression algorithms. Also, determining which compression algorithm of several supported domain specific compression algorithms to use for a given data set to be compressed may not be straight forward in some situations.

BRIEF DESCRIPTION OF DRAWINGS

FIG. 2 is a block-diagram illustrating additional details regarding the compression recipe generation module, including offline training, online training, hybrid training, and compression optimization, according to some embodiments.

Figure 1:
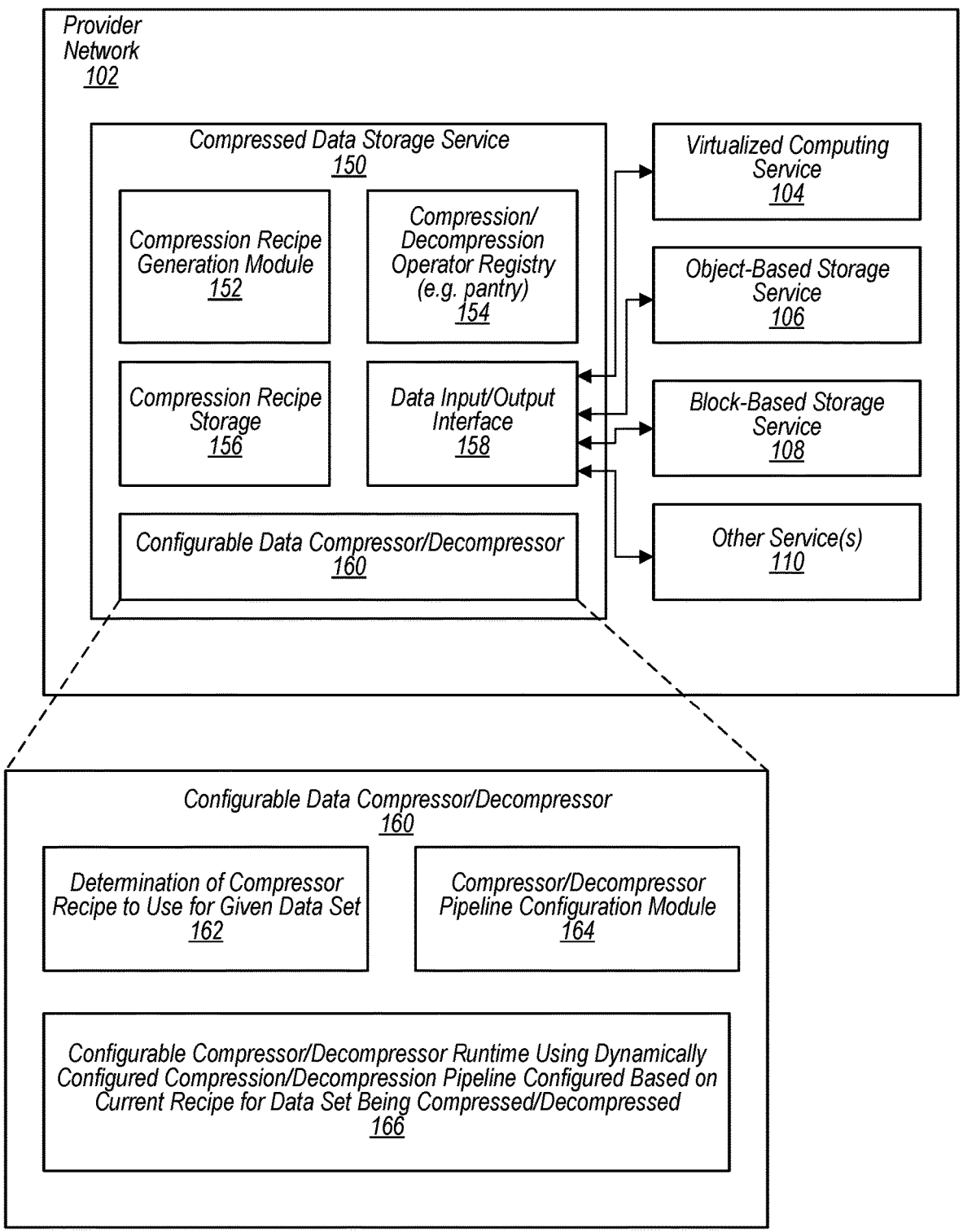
FIG. 1 is a block-diagram illustrating a provider network that includes multiple cloud-based services, wherein one of the services is a compressed data storage service comprising a configurable data compressor/decompressor configured to compress/decompress data from a plurality of data domains, according to some embodiments.

While embodiments are described herein by way of example for several embodiments and illustrative drawings, those skilled in the art will recognize that the embodiments are not limited to the embodiments or drawings described. It should be understood that the drawings and detailed description thereto are not intended to limit embodiments to the particular form disclosed, but on the contrary, the intention is to cover all modifications, equivalents, and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean inclusive of, but not limited to.

DETAILED DESCRIPTION

The systems and techniques described in this disclosure implement a configurable data compressor/decompressor that can be adjustably configured to compress and decompress data from different data domains using a shared registry (e.g., pantry of data compression/decompression operators), according to the various embodiments.

As discussed above, data compression algorithms are often specifically designed to compress data belonging to a particular data domain or having a particular structure. Such custom designed compression algorithms may provide good performance for data belonging to the data domain for which the data compression algorithm was designed, but may provide sub-par performance when being used to compress data from other data domains or having other data structures. In order to deal with these limitations, some systems may use different data compression algorithms for different data domains. However, maintaining a large number of data compression algorithms may be difficult to manage, e.g., may require non-trivial cost and labor.

In some embodiments, a data storage service may include a configurable data compressor/decompressor that is able to efficiently compress and decompress data from a plurality of data domains and having a plurality of data structures. For example, in some embodiments, a configurable data compressor/decompressor comprises a shared compression/decompression operator registry (e.g., pantry) and stores different recipes to be used to compress and decompress different types of data sets. The recipes reference the compression/decompression operators of the registry (e.g., pantry) and indicate where respective ones of the compression/decompression operators are to be used in a compression/decompression pipeline. For example, in some embodiments, a recipe may comprise a directed acyclic graph, wherein nodes of the graph indicate which compression/decompression operator from the registry (e.g., pantry) is to be deployed at the given node and edges of the graph illustrated data flow between the nodes as part of the compression or decompression pipeline.

In some embodiments, a data scientist may specify a recipe to be used for a given data type, such as a customer or other user of the data storage service. Additionally, or alternatively, in some embodiments, a compressed data storage service may include a compression recipe generation module configured to learn respective recipes to be used to compress and decompress respective types of data (e.g., data belonging to different data domains). In some embodiments, offline training may be used to determine recipes for different types of data (e.g., different data domains). In some embodiments, offline training may involve the use of a graph that includes multiple compression operators at respective ones of the nodes of the graph. In some embodiments, a set of training data may be compressed using the graph, wherein the compression operators used at the respective nodes are iteratively changed to probe performance of different combinations of compressor operators at the respective nodes of the graph. In such embodiments, compression results of compressing the same training data using the different combinations of compressor operators may be compared to select a recipe for a given type of data set (e.g., data domain). Also, in some embodiments, a structure of the graph to be used to perform the offline learning may be determined by solving a graph optimization problem. In some embodiments, graph selection and compression operator selection may be performed concurrently in a combined optimization problem. In some embodiments, a customer or other user may provide constraints and/or optimization goals for use in the graph optimization problem. For example, such constraints may include a limit on memory to be used, a limit on an amount of time to execute the compression, a limit on processing resources to be used, a limit on power consumption etc. and such optimization goals may include a goal of maximum compression ratio, minimal compression time, minimized resource usage, or other suitable optimization goals. In some embodiments, a first step in determining a recipe may be determining a graph structure to use for the recipe, for example using a graph optimization problem. Also, a second step may then be to determine which compression operators to use at the respective nodes of the selected graph, which may be determined using offline training as described above (or online or hybrid training as described below).

In some embodiments, online training may include dividing a data set to be compressed into a plurality of blocks and compressing respective ones of the blocks using different combinations of compression operators at different ones of the nodes. In some embodiments, a graph structure to be used for the online training may be selected from a set of stored graph structures or may be selected based on a graph optimization problem using customer/user constraints and goals as described above. In the online training, different combinations of compression operators may be used for successive blocks being compressed and compression results from preceding blocks that have been compressed may be used to select combinations of compression operators to use to compress subsequent blocks.

In some embodiments, a hybrid training process may be used, wherein offline training is used to determine sub-sets of compression operators that are best suited for a given type of data (e.g., data domain). In the hybrid training, the available options of compression operators to use at respective ones of the nodes may be truncated as compared to the pure online training method, wherein the options are reduced to include those compression operators known to be best suited for the particular type of data being compressed. In some embodiments, an offline training approach as described above may be used to determine the sub-sets of compression operators that are best suited for a given type of data (e.g., data domain). Additionally, in some embodiments, a hybrid training process may include using as an input a recipe that has been selected based on offline training and further modifying the recipe based on online training. For example, a graph structure and initial set of compressor operators may be determined for a given data type using offline training. In some embodiments of hybrid training, the graph and set of compressor operators determined via the offline training may be used as a starting point for further online training, wherein data to be compressed is partitioned into blocks and compressor operators are tweaked or otherwise adjusted between compression of respective blocks in order to improve upon the starting configuration determined via the offline training.

As an example, consider a log file that includes comma separated value (CSV) files with three fields: StartTime (string), EndTime (string), Metrics (structured with multiple subfields). An example configurable data pipeline for such an example data domain input is shown in FIG. 5, wherein offline, online, or hybrid training may have been used to generate the recipe corresponding to the pipeline shown in FIG. 5.

Figure 5:
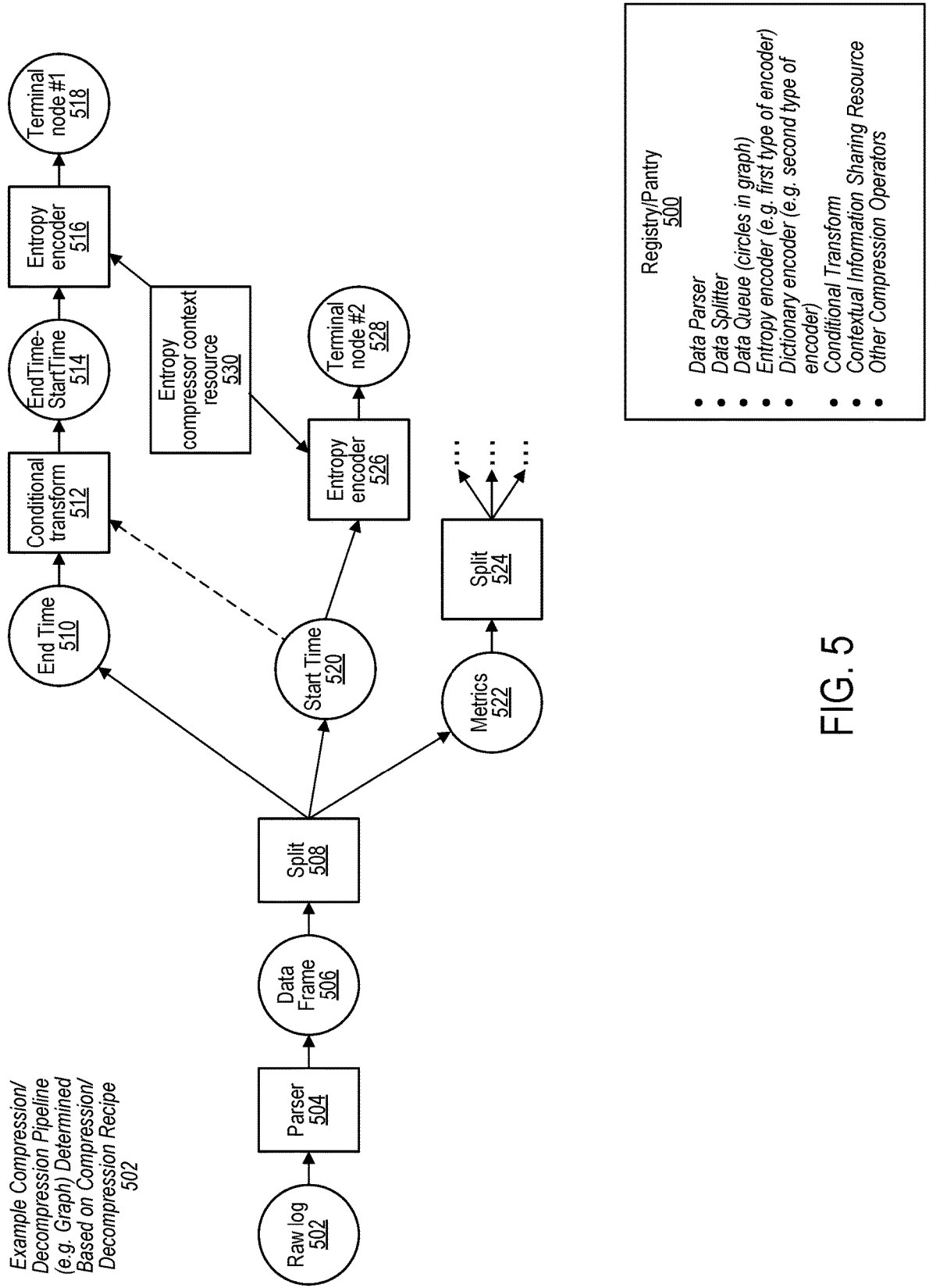
FIG. 5 illustrates a graph representing an example compression/decompression pipeline that may be configured on a configurable compressor using compression operators stored in a registry, wherein the configurable compressor is configured to implement the compression/decompression pipeline based on a recipe for a given data type, according to some embodiments.

For example, in the graph shown in FIG. 5 a "DataFrame" may be a columnarized representation of a query log. The columns of the query log may include data representing an "EndTime", a "StartTime", and "Metrics". For example, these may be the three fields encountered in a particular log. The "Metrics" may further include subfields; therefore, the metrics field may be further parsed/split into the respective sub-fields. The parsed fields (or sub-fields) may then be further transformed before being compressed with an entropy encoder to generate encoded data provided to the terminal nodes, wherein the compressed data provided to the terminal is written to the compressed output. For example, a conditional transform may be applied to the end time, such as subtracting the start time from the end time, such that the end represents an elapsed time after the start time, which may be a more compact data format than explicitly signaling the full end time. Here the start time is used as a side input to the conditional transform, denoted with a dashed arrow. During decompression the start time needs to be decoded first before end time can be decoded.

In some embodiments, a compressor runtime of a configurable compressor may read a recipe, load the transforms and dictionaries referenced by the recipe, and then actually compress an input object, applying the transforms in a way specified by the recipe (potentially also performing online learning to adapt to the data being compressed (e.g., online training or hybrid training). In some embodiments, the runtime writes an output file in a given format (for example, .amzd). This format may reference the library of transforms (e.g., the registry/pantry) needed to decode it. However, the actual recipe used may not need to be indicated in output file.

For example, the recipe may be inferred based on characteristics of the output file or the output file might embed the graph structure required for decompression.

FIG. 1 is a block-diagram illustrating a provider network that includes multiple cloud-based services, wherein one of the services is a compressed data storage service comprising a configurable data compressor/decompressor configured to compress/decompress data from a plurality of data domains, according to some embodiments.

In some embodiments, a provider network 102 includes various cloud-based services such as virtualized computing service 104, object-based storage service 106, block-based storage service 108, and other services 110. Additionally, provider network 102 includes compressed data storage service 150. In some embodiments, compressed data storage service 150 may compress "primary" data stored in the other services of the provider network, such as data objects stored in object-based storage service 106 or volume data stored in block-based storage service 108. Additionally, or alternatively, compressed data storage service 150 may compress "auxiliary" data or "metadata" of the various services such as logs generated for virtualized computing service 104, object-based storage service 106, block-based storage service 108, and other services 110.

In some embodiments, compressed data storage service 150 includes a compression recipe generation module 152 configured to generate a recipe to be used to compress a particular type of data set. For example, compression recipe generation module 152 may use offline training, online training, hybrid training, graph optimization, etc. to select a recipe to be used to compress data of a particular data set type (e.g., data domain). In some embodiments, a user, such as a data scientist, may provide instructions specifying a particular recipe to be used for a particular data set type (e.g., data domain).

In some embodiments, compressed data storage service 150 also includes compression recipe storage 156 which may store information identifying respective recipes to be used for data sets of different types (e.g., of different data domains). In some embodiments, data to be compressed by (or decompressed from) compressed data storage service 150 may be passed through data input/output interface 158. In some embodiments, a client/user may indicate a data set type (e.g., data domain) via data input/output interface 158. Also, in some embodiments, input/output interface 158 may infer a data set type based on characteristics of the data to be compressed or based on information included in a file format for compressed data to be decompressed. In some embodiments, compressed data storage service 150 may include storage devices that store the compressed data within the compressed data storage service 150, or may provide compression and decompression services for data to be stored by other services, such as the object-based storage service 106, etc. In some embodiments, the object-based storage service 106 or other services 110 may provide virtualized storage resources to compressed data storage service 150 to store data within the compressed data storage service 150 using virtualized storage resources that are physically implemented using storage devices of other services, such as object-based storage service 106 or other services 110.

In some embodiments, compression/decompression operator registry 154 (e.g., a pantry of compression/decompression operators that may be used in recipes) stores various compression/decompression operators, such as data parsers, data splitters, data queue templates, various types of encoders, data transforms, conditional data transforms, contextual information sharing resource templates, other compression operators, etc. In some embodiments the compression/decompression operators stored in compression/decompression operator registry 154 may be used at various ones of a plurality of nodes of a graph corresponding to a recipe for a given data set type (e.g., data domain). For example, different recipes may mix and match various ones of the compression/decompression operators stored in compression/decompression operator registry 154 to generate customized compression/decompression pipelines for different data set types, wherein the selected compression/decompression operators selected to generate the customized compression/decompression pipelines are selected from the shared set of common compression/decompression operators stored in compression/decompression operator registry 154.

In some embodiments, configurable data compressor/decompressor 160 includes a software element 162 configured to determine a compression recipe to be used for a given data set. For example, data input/output interface 158 may provide an indication of the data set type and software element 162 may determine a recipe corresponding to the indicated data set type that is stored in compression recipe storage 156. The compressor/decompressor pipeline configuration module 164 may use the recipe determined by software element 162 to configure a compression or decompression pipeline comprising respective ones of the compression/decompression operators stored in registry 154, wherein the operators are located at nodes of a graph according to the recipe, such as shown in FIG. 5.

Also, configurable data compressor/decompressor 160 includes runtime 166 that implements the configurable data compressor/decompressor 160 that has been dynamically configured using the compression/decompression operators of the registry 154 organized in a pipeline defined by a given recipe that is being used to compress or decompress data of a particular data set type (e.g., data domain).

FIG. 2 is a block-diagram illustrating additional details regarding the compression recipe generation module, including offline training, online training, hybrid training, and compression optimization, according to some embodiments.

For example, in some embodiments, a compression recipe generation module of a compressed data storage service, such as compression recipe generation module 152 of compressed data storage service 150, may include an offline training component, an online training component, a hybrid training component, and an interface for receiving user defined constraints and/or goals. For example, compression recipe generation module 152 includes offline training element 202, online training element 204, hybrid training element 206, and a store 208 configured to store user provided constraints and/or optimization goals for use in offline, online, and/or hybrid training. For example, in some embodiments, constraints and/or optimization goals may be provided as metadata included with a data set that is provided to the compressed data storage service 150 via input/output interface 158. In some embodiments, constraints and/or optimization goals may be provided via another interface, such as an administrator interface (not shown in FIG. 1), which may allow a customer's designated administrator to define constraints and/or optimization goals to use in selecting a configurable compressor configuration for compressing data on behalf of the customer.

In some embodiments, offline training 202 may involve a determination of compressor elements stored in the registry 154 (e.g., pantry) that are to be used at various nodes of a graph. For example, the graph may define a compressor pipeline to be used by a configurable compressor runtime 166 to implement a configurable compressor 160 comprising compressor elements as indicated in a recipe at respective ones of the nodes of the graph. In some embodiments, a graph structure selection as well as compressor element selection may be performed as part of the offline training 202. In some embodiments, constraints and/or optimization goals stored in store 208 may be used to perform the offline training 202.

In some embodiments, online training 204 may similarly take into account constraints and/or optimization goals stored in store 208. Also, in some embodiments, online training 204 may involve iterating through a plurality of compressor element selections to compress various ones of a plurality of blocks of a data set that is to be compressed. For example, a first set of compressor elements may be used to compress a given block of a data set and a different set of compressor elements may be used to compress an additional block of the data set. Compression performance may be determined for the first set of compressor elements and the different set of compressor elements. This process may be repeated for any number of iterations. In some embodiments, compression performance of an already considered set of compressor element combinations may be evaluated against a threshold value. In some embodiments, if one or more considered combinations satisfy one or more user defined constraints and have a level of performance within a threshold amount for one or more user specified goals, then the online training may be stopped and the set of compressor elements that satisfied the criteria may be selected for use as the recipe to use for the given data type for which online training 204 is being performed. In some embodiments, additional combinations of compressor elements may continue to be evaluated as long as there are additional blocks of the data set that are to be compressed. In some embodiments, compressor element selection and/or parameters to be used for the compressor elements may be adjusted for subsequent blocks to further improve performance.

In some embodiments, hybrid training 206 may involve taking an initial recipe determined using offline training 202 and further adjusting compressor elements combinations and/or compressor element parameters when compressing respective blocks of a data set to further improve compression efficiency or other performance parameters. Also, in some embodiments, some compressor elements and/or compressor element combinations may be ruled out from further consideration in hybrid training 206 based on information learned in an offline training, such as offline training 202. For example, a recipe determined for a given data set type (e.g., data domain) that has been learned using offline training 202, may exclude from use certain compressor elements that are not well suited for the particular type of data set (e.g., data domain) that is being compressed. This exclusion of less likely to use compressor elements may speed up the training performed in hybrid training 206, in some embodiments.

Figure 3:
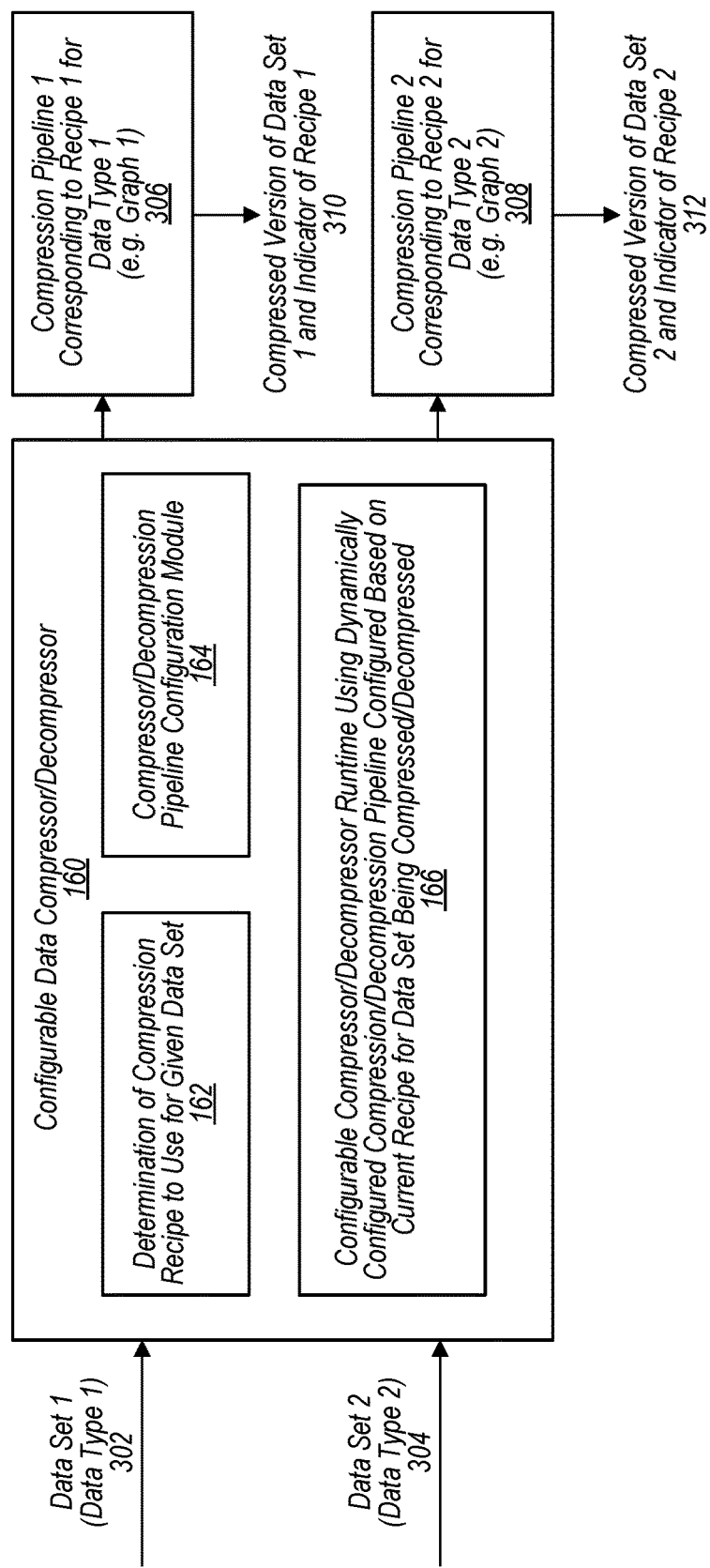
FIG. 3 is a block-diagram illustrating a configurable data compressor compressing two different data sets using different recipes that involve compression using different pipelines configured using compression operators stored in a common registry (e.g., pantry), according to some embodiments.

FIG. 3 is a block-diagram illustrating a configurable data compressor compressing two different data sets using different recipes that involve compression using different pipelines configured using compression operators stored in a common registry (e.g., pantry), according to some embodiments.

In some embodiments, the same configurable data compressor 160 may implement various different compression pipelines 306 and 308 via runtime 166 using various different recipes corresponding to different data set types (e.g., different data domains). For example, configurable data compressor 160 may receive a first data set 302 that is to be compressed and a second data set 304 that is to be compressed. As an example, the first data set 302 may include log data organized into three columns, such as start time, end time, and metrics (as previously discussed) and the second data set 304 may include a different configuration of log data, e.g., a different number of columns or different types of data in the respective columns, or second data set 304 may include a completely different genre of data, such as genomic data, as an example. In some embodiments, a data type for the respective data sets 302 and 304 may be communicated to configurable data compressor 160 (for example as metadata associated with the data sets 302 and 304), or in some embodiments, configurable data compressor 160 may determine respective data types of data sets 302 and 304, for example based on the structure and/or contents of the data sets.

In some embodiments, component 162 of configurable data compressor 160 may determine a data type of a received data set, for example based on associated metadata and/or by inference based on a structure and/or content of the received data set. Once a data set type is determined, a recipe corresponding to the determined data type may be retrieved from compression recipe storage 156 and compressor pipeline configuration module 164 may configure a set of executable program instructions that include compressor elements referenced, in the recipe, from registry 154 and arranged in a pipeline configuration specified in the recipe from compression recipe storage 156. The configured set of executable program instructions may then be executed in runtime 166 to implement a customized configuration of configurable data compressor 160 that has been configured to compress the respective data type of the given data set being compressed, such as data set 302 or 304.

In some embodiments, an output of configurable data compressor 160 may include encoded data streams from the various terminal nodes of the data compression pipeline defined by the respective recipes, such as terminal nodes 518 and 528 shown in FIG. 5, as a few examples. Additionally, the output files 310 and 312 may include an indication of a graph representing the compression pipeline 306 or 308 that was used to compress the data and/or the output files 310 and 312 may reference the respective recipes that were used to compress the respective data sets 302 and 304 to generate output files 310 and 312, respectively.

For example, in some embodiments, a description of a pipeline graph 306 or 308 to be used to decompress a given one of the compressed output files 310 or 312 may be included in header data of the output file 310 or 312. In some embodiments, the header may reference a recipe to use to decompress the output file, such as output file 310 or 312. In some embodiments, a description of the graph to be used to implement pipeline 306 or 308 may be used in lieu of a reference to a recipe for pipeline 306 or 308. In this way the compressor and decompressor are not required to store the same recipe information, and this may allow for stand-alone decompressors that are independent of the compressors that compressed the data being decompressed (e.g., output files 310 or 312). In some embodiments, a third-party may store recipe information usable by configurable data compressor 160, wherein a compressor-side is provided the recipe information by the third-party in order to generate a compressed file 310 or 312 and wherein the decompressor-side is provided the recipe information from the third-party in order to decompress the compressed file 310 or 312.

Also, in some embodiments, a recipe may include multiple paths, wherein depending on the data being compressed one path is selected in lieu of the other. In such situations, compressed data file 310 or 312 may include one or more flags to indicate a path selected (or not selected) during compression.

Figure 4:
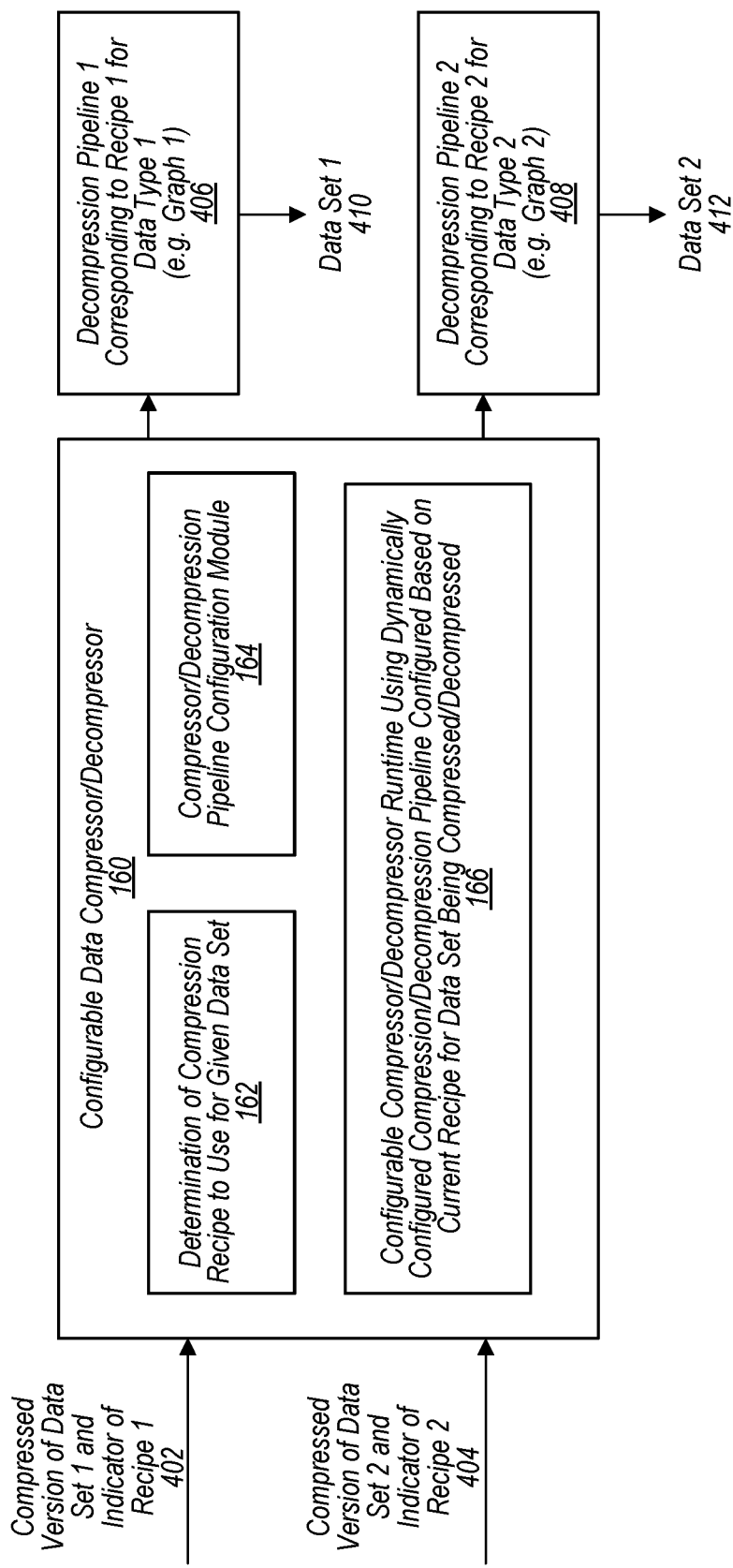
FIG. 4 is a block-diagram illustrating a configurable data decompressor decompressing two different data sets using different recipes that involve decompression using different pipelines configured using decompression operators stored in a common registry (e.g., pantry), according to some embodiments.

FIG. 4 is a block-diagram illustrating a configurable data decompressor decompressing two different data sets using different recipes that involve decompression using different pipelines configured using decompression operators stored in a common registry (e.g., pantry), according to some embodiments.

For example, compressed version of data set 1 and indicator of recipe 1 (402) may be the output 310 of compression pipeline 1 (306) as shown in FIG. 3. Similarly, compressed version of data set 2 and indicator of recipe 2 (404) may be the output 312 of compression pipeline 2 (308) as shown in FIG. 3.

In some embodiments, a recipe indicator included in a compressed data file may be a description of a graph corresponding to a compression pipeline used to compress the data included in the file. In some embodiments, the recipe indicator may be a description of a graph corresponding to a decompression pipeline to be used to decompress the data included in the file. In some embodiments, a decompression pipeline for decompressing the data included in the file may be different than a compression pipeline used to compress the data of the file. For example, a compression pipeline may have optional branches that are selected based on characteristics of the data being compressed, whereas the decompression pipeline may omit optional branches that were not used in the compression. In some embodiments, a recipe indicator included in a compressed data file may reference a recipe stored in a shared location without actually including a graph description in the compressed data file. For example, the compressed data file may reference a recipe stored in a shared location without actually including a graph description for the recipe in the compressed data file. In some embodiments, the compressor and the decompressor may maintain a similar set of compression operators that may be determined using the recipe indicator. In some embodiments, a recipe indicator may be inferred based on the formatting of the compressed data in the compressed data file. For example, each terminal node as shown in FIG. 5 may write compressed data to the compressed data file as separate compressed entities in the compressed data file. In some embodiments, a structure of the compression graph may be inferred based on the number, arrangement, and encoding syntax of the compressed entities included in the compressed data file.

In a similar manner as described for FIG. 3, the configurable data compressor/decompressor 160 may use the recipe determined based on the recipe indicator in the compressed data files 402 and 404 to configure the configurable data compressor/decompressor 160 into a decompression pipeline as specified for the corresponding recipes corresponding to the compressed data files 402 and 404. In some embodiments, the element 162 may be omitted as the recipe can be directly determined from the recipe indicator included in the compressed data file 402 or 404. In some embodiments, compressor/decompressor pipeline configuration module 164 may compile a decompressor code to execute in runtime 166 based on the indicated recipe and using compressor/decompressor operators from registry 154. For example, decompression pipeline 406 may be implemented to decompress compressed file 402 to generate data set 1 (410) and decompression pipeline 408 may be implemented to decompress compressed file 404 to generate data set 2 (412).

FIG. 5 illustrates a graph representing an example compression/decompression pipeline that may be configured on a configurable compressor using compression operators stored in a registry, wherein the configurable compressor is configured to implement the compression/decompression pipeline based on a recipe for a given data type, according to some embodiments.

For example, raw log 502 may include a start time column, an end time column, and metrics as part of a raw log file. Parser 504 may parse the raw log file 502 into each of the respective columns. The output of parser 504 may be stored in data buffers, such as buffer 510 (end time), buffer 520 (start time), and buffer 522 (metrics). As an example, a conditional transform 512 may be applied to the end time data to subtract the start time data. This may reduce the bit length of the end time data. Also, the output of the conditional transform may be stored in a buffer 514 (end time minus start time). In some embodiments, the transformed end time data stored in buffer 514 and the start time data stored in buffer 520 may be encoded using respective entropy encoders 516 and 526. In some embodiments, a contextual information sharing resource 530 may share contextual information between the respective entropy encoders 516 and 526, or reduce computational overhead by reusing the contexts. The outputs of the respective entropy encoders 516 and 526 may be written to a compressed data file via terminal nodes 518 and 528, where the terminal nodes simply contain binary data that can be directly serialized to file. In some embodiments, the metrics stored in buffer 522 may further be split via splitter 524 into different streams which may be further processed using any of the compressor operators as shown in registry/pantry 500.

In some embodiments, a compressor/decompressor pipeline configuration module 164 may configure the pipeline as shown in FIG. 5 (or any other pipeline) specified in a given recipe using the compression/decompression operators of registry/pantry 500, and according a graph description for the given recipe. Note that registry/pantry 500 includes example compression/decompression operators that may be used, but should not be interpreted as an exhaustive list. In some embodiments, various other compression/decompression operators may be used.

Figure 6:
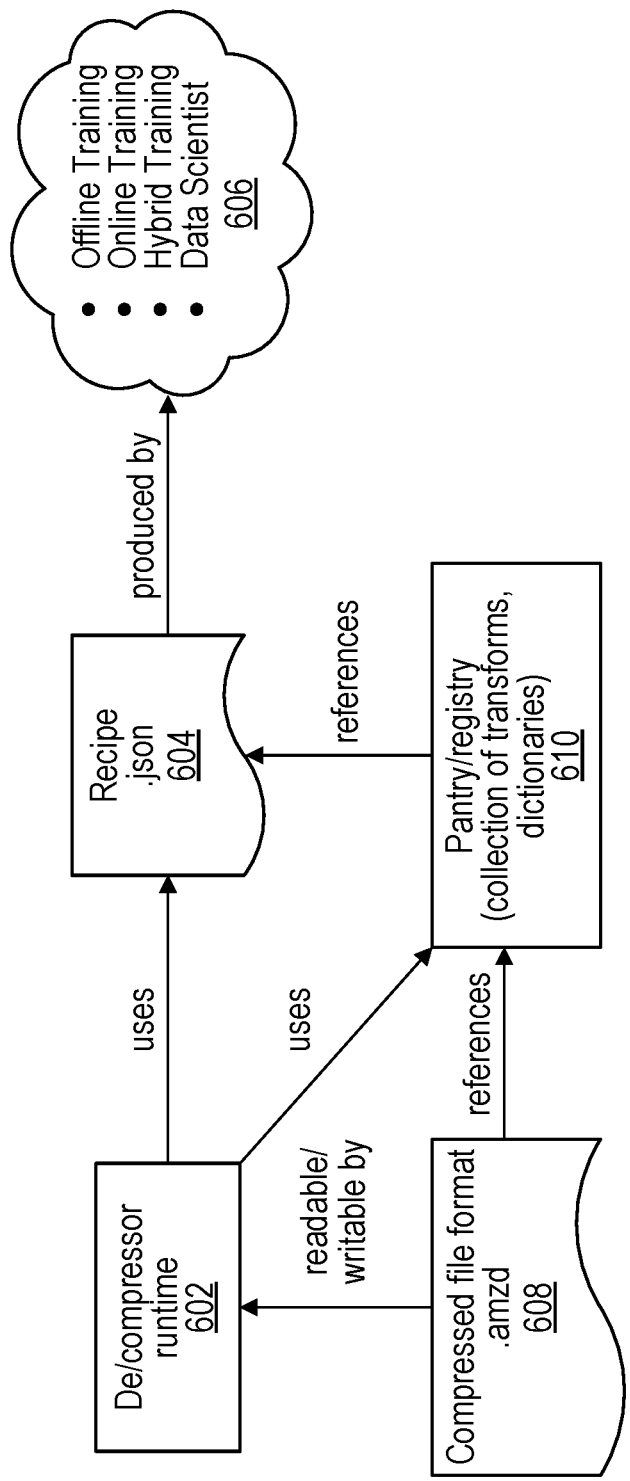
FIG. 6 illustrates relationships between a compressed file format, a compressor/decompressor runtime and a recipe for a data type of the compressed file, according to some embodiments.

FIG. 6 illustrates relationships between a compressed file format, a compressor/decompressor runtime and a recipe for a data type of the compressed file, according to some embodiments.

In some embodiments, a compressor/decompressor runtime 602, which may be similar to runtime 166 described in FIGS. 1, 3, and 4, uses a recipe 604 (which may be formatted as a JSON file, or using another suitable file format) and compressors operators included in a pantry/registry 610. The recipe 604 may reference the compressor operators from the registry 610 that are to be used in the runtime 602. Also, the output of the compressor may be a compressed file format 608 that is readable and writable by the runtime 602 and which references the compressor operators of the pantry/registry 610. For example, a compressed file format 608 may be decompressed in runtime 602 using decompressor operators from pantry 610 as indicated in a recipe indicator corresponding to a recipe 604. The decompressed file may then be read or written to in runtime 602 and later recompressed in runtime 602 using compressor operators from pantry/registry 610 as referenced by a recipe 604 to generate an updated compressed file 608. In some embodiments, the recipe 604 to be used may be produced by offline training, online training, hybrid training, or may be manually determined, for example by a data scientist.

Figure 7:
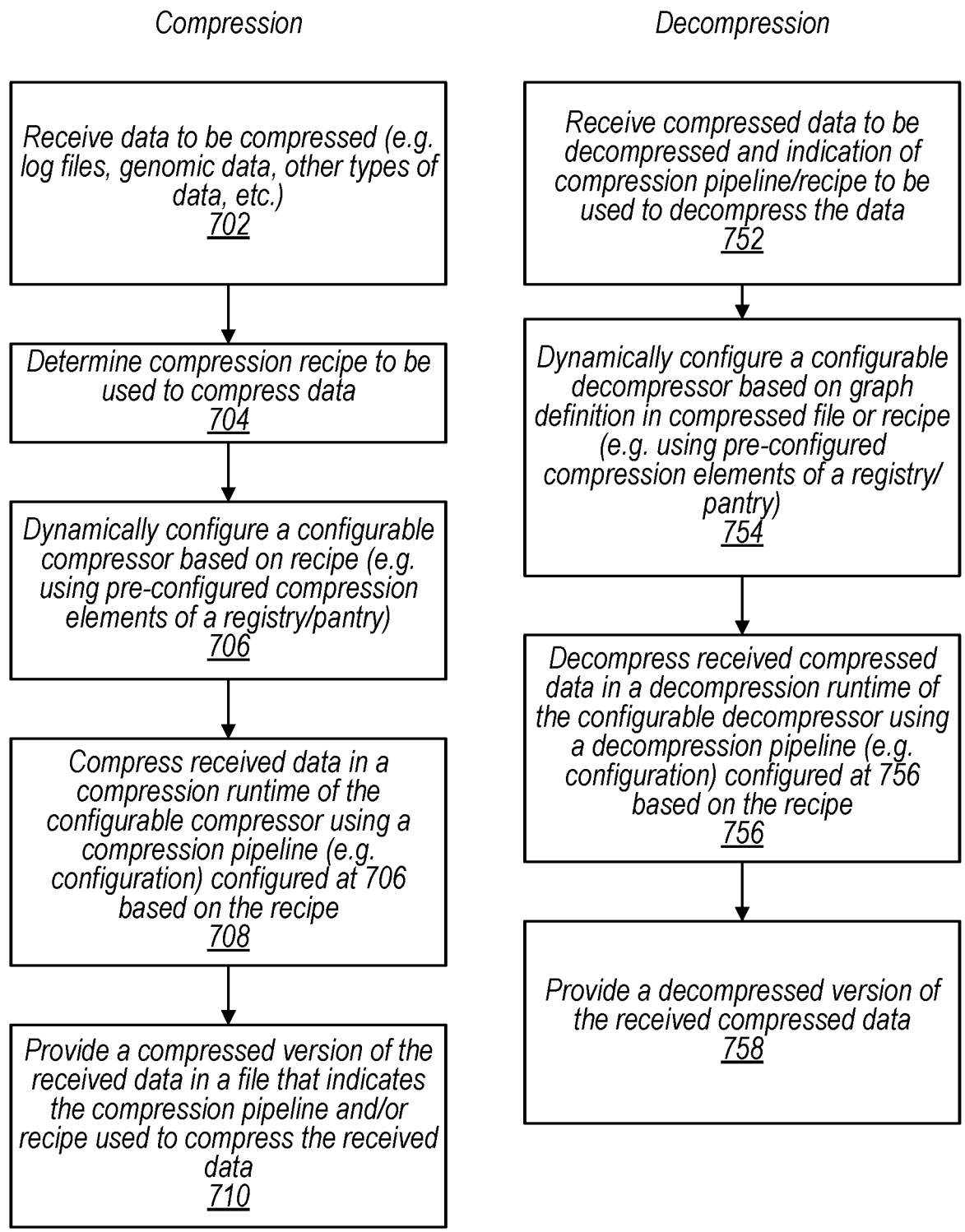
FIG. 7 is a flowchart illustrating respective processes for compressing and decompressing data sets using a data compressor/decompressor compressor, according to some embodiments.

FIG. 7 is a flowchart illustrating respective processes for compressing and decompressing data sets using a data compressor/decompressor compressor, according to some embodiments.

At block 702, a configurable data compressor receives data to be compressed, such as log files, genomic data, textual data, or other types of data. At block 704, the configurable compressor determines a compression recipe to be used to compress the received data. For example, the recipe may be indicated by a data scientist, or may be determined using offline, online, or hybrid learning, as described herein. At block 706, the configurable compressor dynamically configures itself (e.g., implements a compression pipeline in a runtime of the compressor) based on the recipe determined at block 704 and using compressor elements of a pantry/registry accessible by (or included in) the configurable compressor. At block 708, the configurable compressor compresses received data in a compression runtime of the configurable compressor using a compression pipeline configured at block 706 based on the recipe determined at block 704. Then, at block 710, the configurable compressor provides a compressed version (e.g., compressed data file) of the received data in a file format that indicates a description of the graph or indicates a recipe used to configure a decompression pipeline for decompressing the compressed version of the received data. In some embodiments, the received data may be uncompressed data or may be data that has been compressed using a different compression technique that is to be further compressed. In some embodiments, the received data may include a mixture of compressed and uncompressed data that is to be further compressed.

In order to decompress the compressed version of the received data, at block 752, a configurable decompressor receives compressed data to be decompressed along with an indication of a graph for a compression pipeline (or an indication of a recipe) to be used to decompress the compressed data. At block 754, the configurable decompressor dynamically configures a itself (e.g., implements a decompression pipeline in a runtime of the decompressor) based on a graph definition included in a compressed data file being decompressed or based on a recipe indicated in the compressed data file. In some embodiments, the graph definition and/or recipe may be inferred from a structure and/or syntax of the compressed data file. At block 756, the configurable decompressor decompresses the received compressed data in a decompression runtime of the configurable decompressor using a decompression pipeline configured at block 754 based on the recipe indicated in the compressed data file or otherwise provided with the compressed data file. Then, at block 758, the configurable decompressor provides a decompressed version of the received compressed data.

Figure 8:
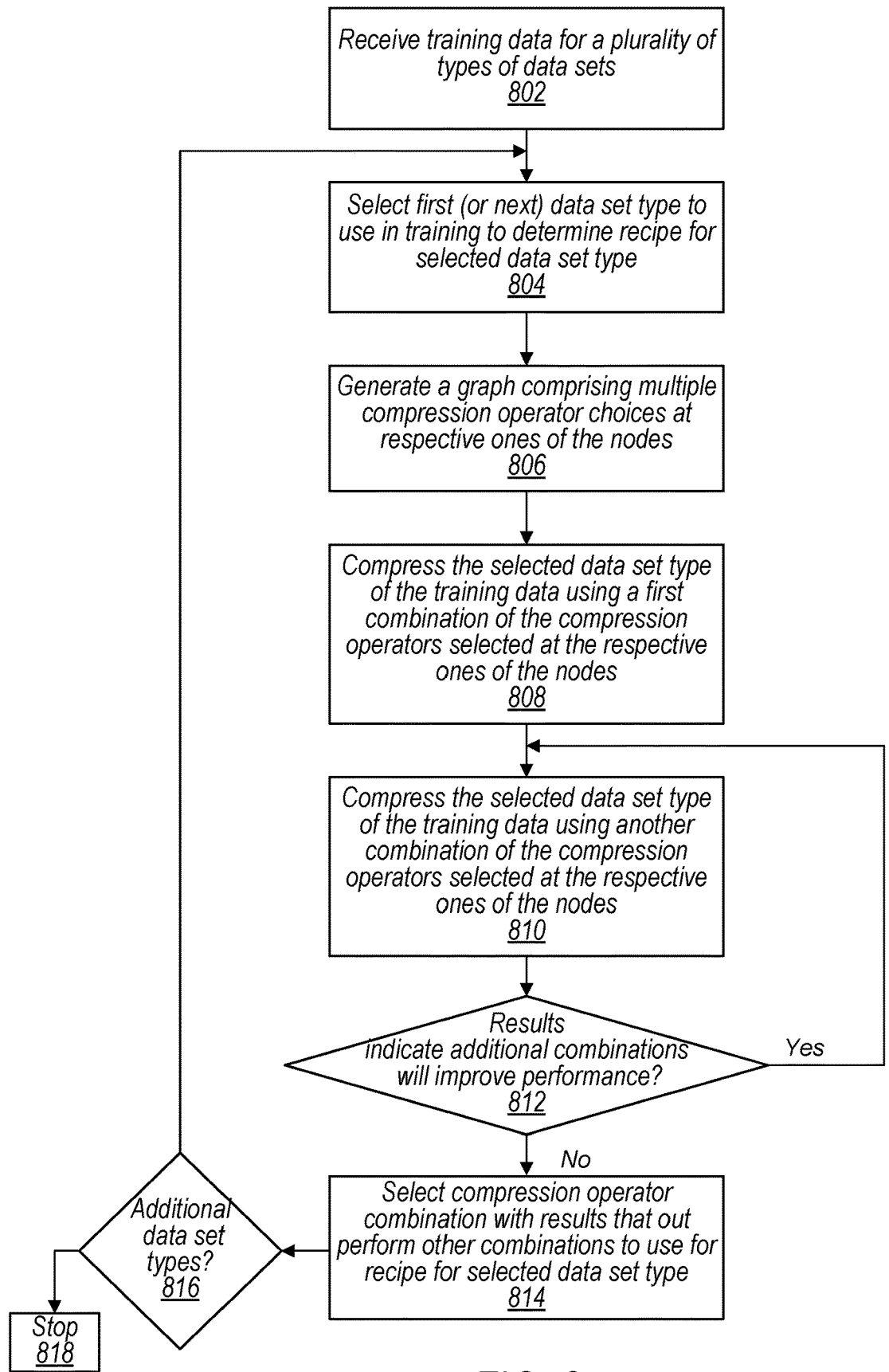
FIG. 8 is a flowchart illustrating an offline training process for learning recipes to be used for different types of data sets, according to some embodiments.

FIG. 8 is a flowchart illustrating an offline training process for learning recipes to be used for different types of data sets, according to some embodiments.

At block 802, an offline training element receives training data for a plurality of data types. For example, each of the sets of training data may have a known data type, such as log data, genomic data, etc. Also, the data types may be more granular, such as to distinguish between different types of logs, as an example. At block 804, the offline training element selects a first (or next) data set type to use in training in order to determine a recipe to be used with the respective data set type. For example, the offline training may learn that certain recipes are good at compressing log data while other recipes are good at compressing genomic data, as a few examples. As a further example, the offline training may determine that some recipes are better at compressing certain types of log files while other recipes are better at compressing other types of log files.

In some embodiments, constraints and optimization goals may be provided by a user, administrator, data scientist, etc. and may be used in the offline training. For example, in some embodiments, compressor performance may be determined within a provided set of constraints, such as constraints on memory usage, processor usage, power usage, compression time, etc. Also, in some embodiments, compressor performance may be evaluated using optimization goals such as achieving a high compression ratio, compressing in a minimal amount of time, conserving power, etc. In some embodiments, an optimization goal may differ from a constraint in that a constraint may be required to be met, whereas an optimization goal is used in evaluation but does not set a definite constraint requirement.

Also, in some embodiments, the offline training as described herein may be performed for the configurable compressor as a whole (e.g., globally) or may be performed for respective sub-components of the configurable compressor, such as branch by branch or node by node of a compression graph. For example, at block 806 a graph (or sub-component of a graph) to be used in the offline training is generated (or selected), wherein the graph (or sub-component of the graph) includes one or more nodes, and wherein at least one of the one or more nodes includes a set of compressor operators to be evaluated at the respective node(s).

At block 808, the offline training element compresses the selected data set type (using the full compressor or a portion of the compressor corresponding to graph portion being evaluated) as determined at block 804 (and/or block 806) using a first combination of compressor operators from the one or more sets of compressor operators to be evaluated at the respective nodes. Also, at block 810, the offline training element compresses the same selected data set type (using the same full compressor or the same portion of the compressor corresponding to the graph portion being evaluated) as determined at block 804 (and/or block 806) using a second (or subsequent) combination of compressor operators from the one or more sets of compressor operators to be evaluated at the respective nodes. At block 812, the offline training element compares the performance of the respective compressor element combinations and determines whether or not a compressor element configuration can be assigned for the recipe or whether additional combinations need to be evaluated. In some embodiments, all compressor element combinations may be evaluated. In some embodiments, if compressor performance satisfies one or more thresholds (which may be determined based on user provided constraints and/or optimization goals) then the offline training element may forego evaluating additional combinations. In some embodiments, a predetermined number of combinations may be evaluated and a given combination having compressor performance better than other ones of the combinations may be selected. In some embodiments, different selection criteria may be used for different portions of a graph for a configurable compressor. For example, different selection criteria may be used at the branch level than is used at the global level, as an example. At block 814, the offline training element select a compressor operator combination for the full compressor pipeline graph (or portion thereof being evaluated) based on the compression results determined for the combinations considered in the loop including blocks 808, 810, and 812.

At block 816, the offline training element determines whether or not there are other types of data set for which training is to be performed to determine a recipe, such as other types of log data, or genomic data, or various other data types in addition to the data types for which recipes have already been determined. If so, the process reverts to block 804, if not, then the training process is ended at block 818. In some embodiments, the recipes and corresponding data set types associated with the determined recipes may be stored in compression recipe storage 156 and may be used to compress future data sets that are determined to be of the same data set type that is associated with the recipe.

Figure 9:
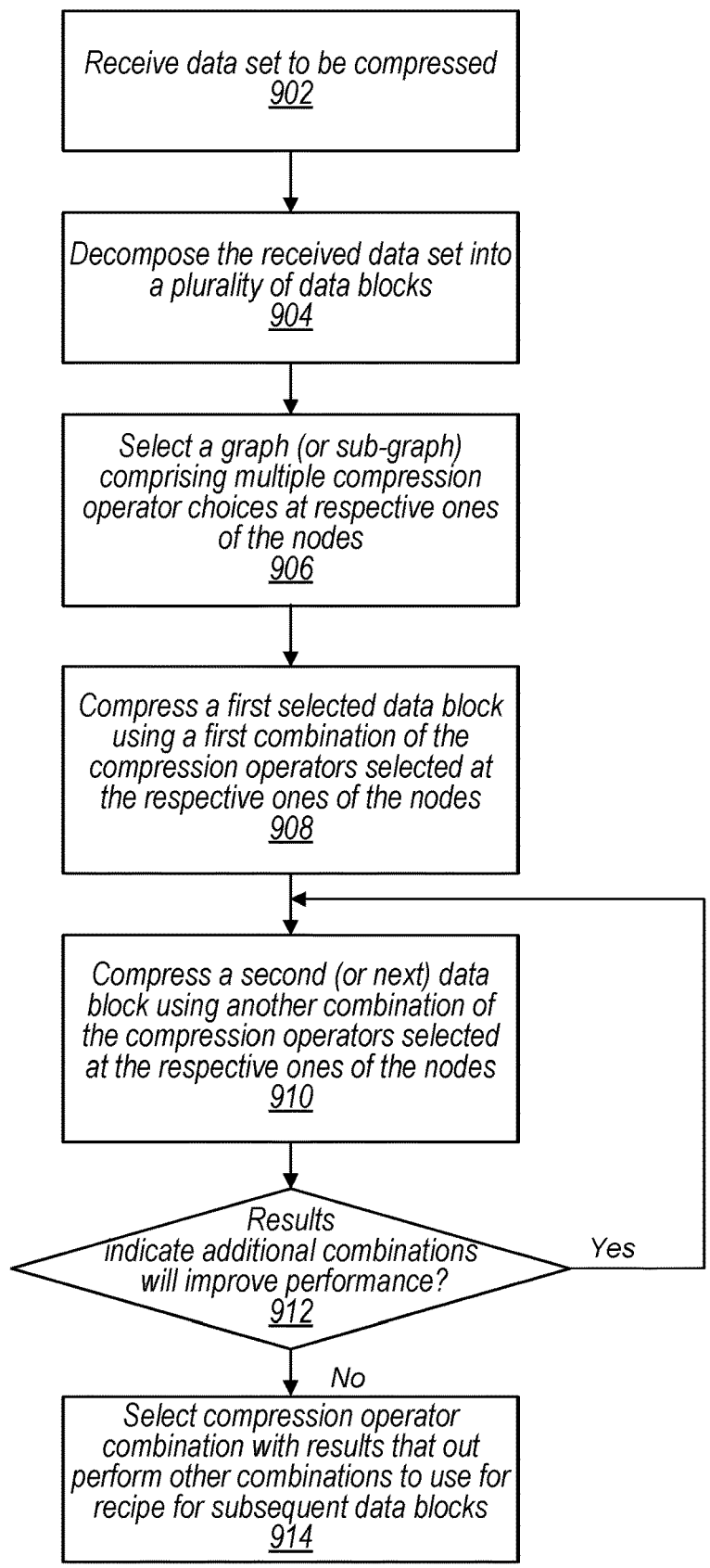
FIG. 9 is a flowchart illustrating an online training process for determining a recipe to use for a given data set, according to some embodiments.

FIG. 9 is a flowchart illustrating an online training process for determining a recipe to use for a given data set, according to some embodiments.

In some embodiments, online training can be performed in a similar manner as the offline training. However, in the online training, instead of using a training data set, the training may be performed "online" while compressing actual data set submitted to the configurable compressor as a compression job to be performed. In the online training, the received data set may be partitioned into blocks and training results for a first block may be used to improve a configurable compressor configuration used to compress subsequent blocks.

For example, at block 902, the configurable compressor receives a data set to be compressed, and at block 904 decomposes the received data set to be compressed into a plurality of data blocks. At block 906, the configurable compressor selects a graph (or sub-component of a graph) to be used in the online training, wherein the graph (or sub-component of the graph) includes one or more nodes, and wherein at least one of the one or more nodes includes a set of compressor operators to be evaluated at the respective node(s).

At block 908, the online training element compresses the selected data block (using the full compressor or a portion of the compressor corresponding to graph portion being evaluated) as determined at block 906 using a first combination of compressor operators from the one or more sets of compressor operators to be evaluated at the respective nodes. Also, at block 910, the online training element compresses a next selected data block that is similar in size to the first selected data block (using the same full compressor or the same portion of the compressor corresponding to the graph portion being evaluated) as determined at block 906 using a second (or subsequent) combination of compressor operators from the one or more sets of compressor operators to be evaluated at the respective nodes. At block 912, the online training element compares the performance of the respective compressor element combinations and determines whether or not a compressor element configuration can be updated in the online training for the current recipe or whether additional combinations need to be evaluated while compressing subsequent data blocks. In some embodiments, each data block may be compressed using compressor elements or parameters that have been adjusted based on compression performance of a preceding one or more data blocks. In some embodiments, if compressor performance satisfies one or more thresholds (which may be determined based on user provided constraints and/or optimization goals) then the online training element may forego evaluating additional combinations. In some embodiments, online training may be performed continuously in order to allow the configurable compressor to adapt to structural changes in a data set over time. For example, log conditions may be dynamic such that continuous adjustment improves compressor performance as the log characteristics change. At block 914, the online training element selects a compressor operator combination for the full compressor pipeline graph (or portion thereof being evaluated) to be used for subsequent data blocks based on the compression results determined for the combinations considered in the loop including blocks 908, 910, and 912.

Figure 10:
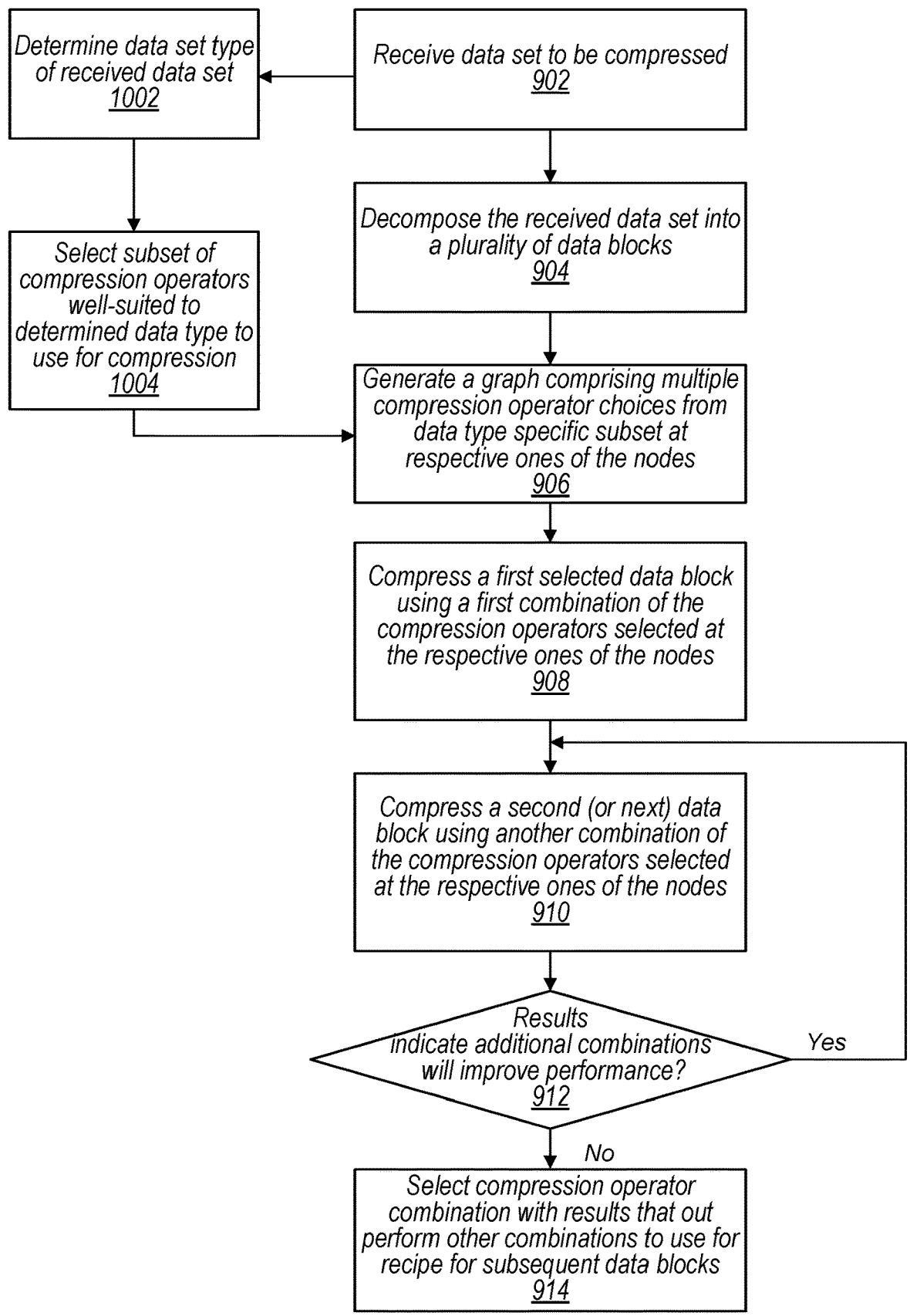
FIG. 10 is a flowchart illustrating a hybrid training process wherein learning from an offline training process is used to narrow compressor operators considered during an online training process, according to some embodiments.

FIG. 10 is a flowchart illustrating a hybrid training process wherein learning from an offline training process is used to narrow compressor operators considered during an online training process, according to some embodiments.

In some embodiments, a hybrid training process may be similar to an online training process. However, the hybrid training process may use an already trained recipe generated via offline training (or previous online or hybrid training) as a starting recipe for the training. Also, in some embodiments, in the hybrid training the compressor operator options to be evaluated at respective nodes may be truncated based on the data type. For example, at block 1002 a data set type may be determined and at block 1004 only a subset of available compressor operators may be included at least some of the nodes based on the determined data set type. For example, other compressor operators may be excluded from consideration based on the data set type.

Figure 11:
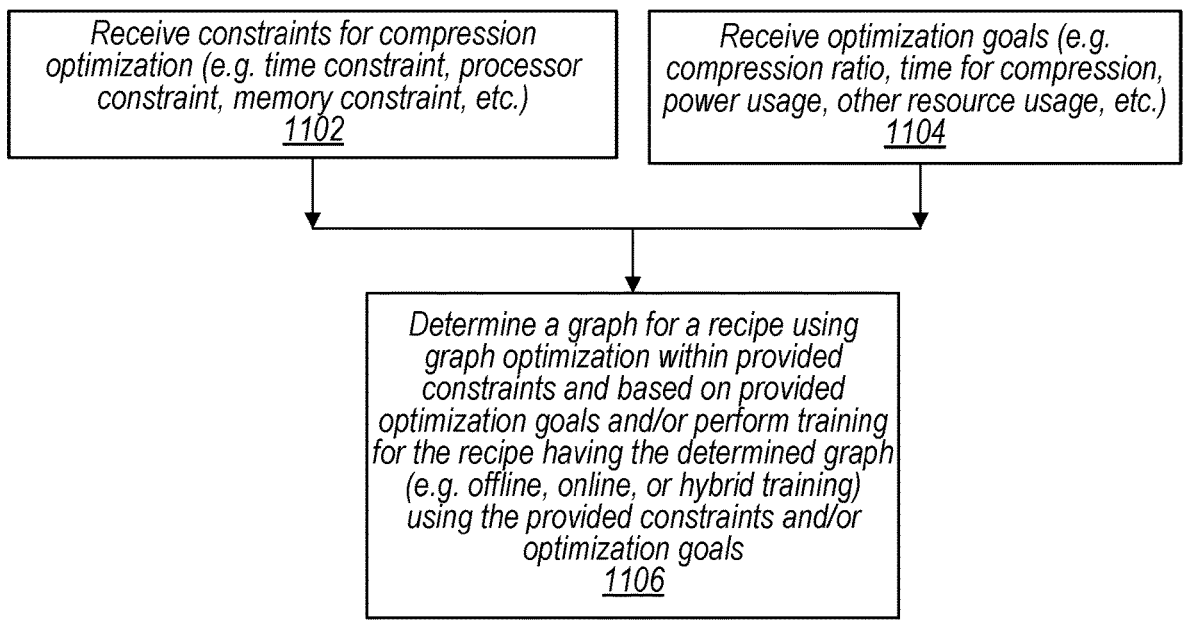
FIG. 11 is a flowchart illustrating the use of an optimization algorithm when determining a recipe to be used for a given data type, according to some embodiments.

FIG. 11 is a flowchart illustrating the use of an optimization algorithm when determining a recipe to be used for a given data type, according to some embodiments.

In some embodiments, constraints (as described herein) may be received at block 1102 and optimization goals (as described herein) may be received at block 1104. In some embodiments, a graph optimization problem may be solved at block 1106 to determine a graph to use for a recipe based on the constraints and optimization goals received at 1102 and 1104. Also, in some embodiments, both graph structure and compressor operator selection may be iteratively varied for example in offline training as described in FIG. 8. In some embodiments, the contains and optimization goals may be used in the offline training, online training, and/or hybrid training as described herein.

Figure 12:
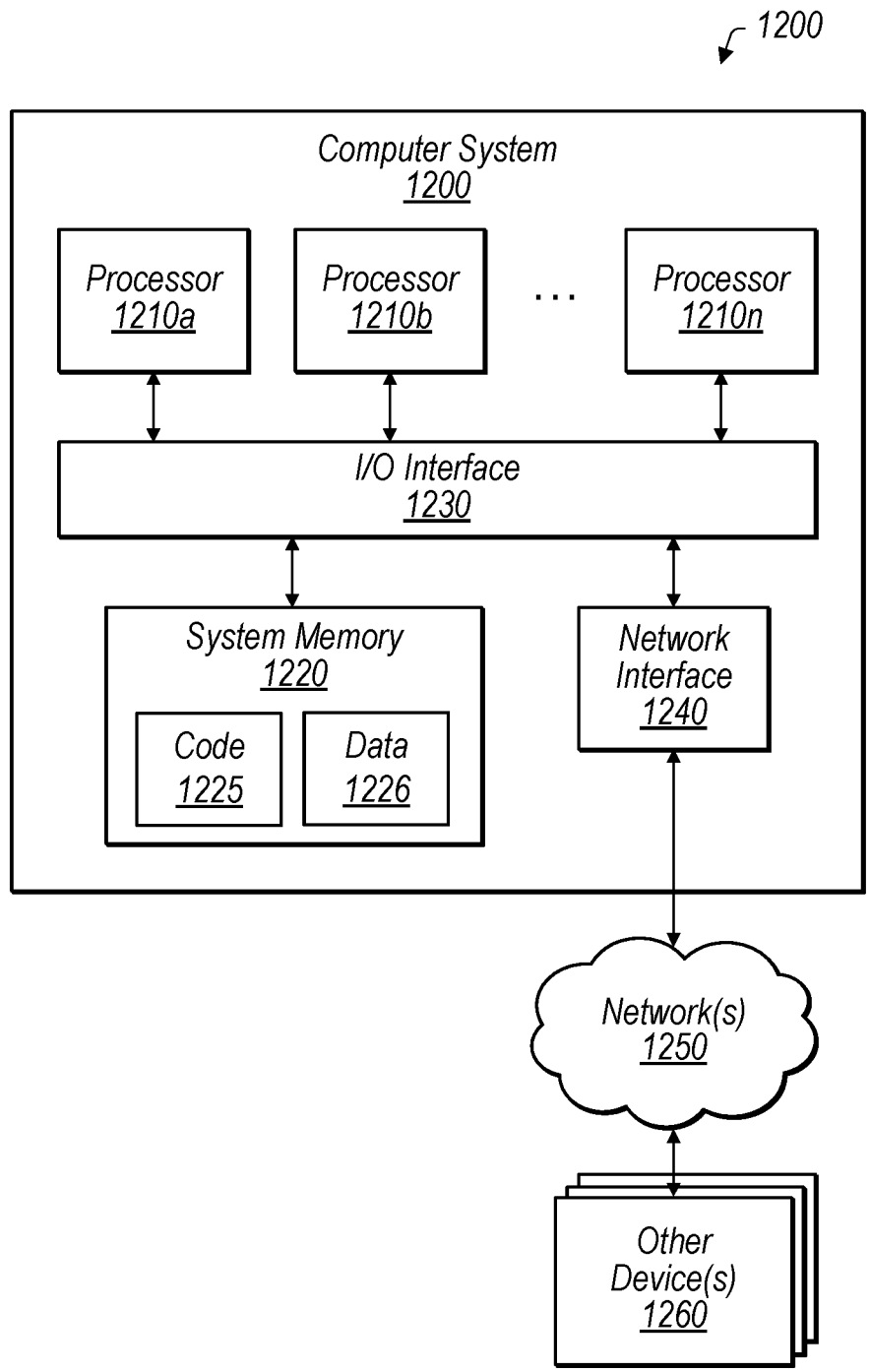
FIG. 12 illustrates an example computer system, that may be used to implement an ontology-based annotation service and/or other systems or services, as described herein.

FIG. 12 illustrates an example computer system, computer system 1200, where computer system 1200 may be configured to implement configurable compressors/decompressors, a compressed data storage service, other services, resource hosts, control planes, or other components of service provider network services, according to the discussed embodiments and examples. In different embodiments, the computer system may be any of various types of devices, including, but not limited to, a personal computer system, desktop computer, laptop, notebook, or netbook computer, mainframe computer system, handheld computer, workstation, network computer, a mobile device, a consumer device, video game console, handheld video game device, application server, storage device, or in general any type of computing or electronic device.

Further, the systems and methods described herein may in various embodiments be implemented by any combination of hardware and software. For example, the methods may be implemented by computer system 1200 that includes one or more processors executing program instructions stored on a computer-readable storage medium coupled to the processors. The program instructions may be configured to implement the functionality described herein (e.g., the functionality of various servers and other components that implement the data storage service described herein). The various methods as illustrated in the figures and described herein represent example embodiments of methods. The order of any method may be changed, and various elements may be added, reordered, combined, omitted, or modified.

Computer system 1200 includes one or more processors 1210a-1210n (any of which may include multiple cores, which may be single or multi-threaded) coupled to a system memory 1220 via an input/output (I/O) interface 1230. Computer system 1200 further includes a network interface 1240 coupled to I/O interface 1230. In various embodiments, computer system 1200 may be a uniprocessor system including one processor, or a multiprocessor system including several processors (e.g., two, four, eight, or another suitable number). Processors 1210 may be any suitable processors capable of executing instructions. For example, in various embodiments, processors 1210 may be general-purpose or embedded processors implementing any of a variety of instruction set architectures (ISAs), such as the x86, PowerPC, SPARC, or MIPS ISAs, or any other suitable ISA. In multiprocessor systems, each of processors 1210 may commonly, but not necessarily, implement the same ISA. The computer system 1200 also includes one or more network communication devices (e.g., network interface 1240) for communicating with other systems and/or components over a communications network (e.g., Internet, LAN, etc.). For example, a client application executing on system 1200 may use network interface 1240 to communicate with a server application executing on a single server or on a cluster of servers that implement one or more of the components of the systems described herein. In another example, an instance of a server application executing on computer system 1200 may use network interface 1240 to communicate with other instances of the server application (or another server application) that may be implemented on other computer systems. Further, computer system 1200, via I/O interface 1230, may be coupled to one or more input/output devices 1250, such as cursor control device 1260, keyboard 1270, camera device 1290, and one or more displays 1280.

In the illustrated embodiment, computer system 1200 also includes one or more persistent storage devices and/or one or more I/O devices 1250. In various embodiments, persistent storage devices may correspond to disk drives, tape drives, solid state memory, other mass storage devices, or any other persistent storage device. Computer system 1200 (or a distributed application or operating system operating thereon) may store instructions and/or data in persistent storage devices, as desired, and may retrieve the stored instruction and/or data as needed. For example, in some embodiments, computer system 1200 may host a storage system server node, and persistent storage may include the SSDs attached to that server node.

Computer system 1200 includes one or more system memories 1220 that are configured to store instructions and data accessible by processor(s) 1210. In various embodiments, system memories 1220 may be implemented using any suitable memory technology, (e.g., one or more of cache, static random-access memory (SRAM), DRAM, RDRAM, EDO RAM, DDR 10 RAM, synchronous dynamic RAM (SDRAM), Rambus RAM, EEPROM, non-volatile/Flash-type memory, or any other type of memory). System memory 1220 may contain program instructions 1225 that are executable by processor(s) 1210 to implement the methods and techniques described herein. In various embodiments, program instructions 1225 may be encoded in platform native binary, any interpreted language such as Java™ bytecode, or in any other language such as C/C++, Java™, etc., or in any combination thereof. For example, in the illustrated embodiment, program instructions 1225 include program instructions executable to implement the functionality of a compressed data storage service and/or configurable data compressor/decompressed according to different embodiments. In some embodiments, program instructions 1225 may implement multiple separate clients, server nodes, and/or other components.

In some embodiments, program instructions 1225 may include instructions executable to implement an operating system (not shown), which may be any of various operating systems, such as UNIX, LINUX, Solaris™, MacOS™, Windows™, etc. Any or all of program instructions 1225 may be provided as a computer program product, or software, that may include a non-transitory computer-readable storage medium having stored thereon instructions, which may be used to program a computer system (or other electronic devices) to perform a process according to various embodiments. A non-transitory computer-readable storage medium may include any mechanism for storing information in a form (e.g., software, processing application) readable by a machine (e.g., a computer). Generally speaking, a non-transitory computer-accessible medium may include computer-readable storage media or memory media such as magnetic or optical media, e.g., disk or DVD/CD-ROM coupled to computer system 1200 via I/O interface 1230. A non-transitory computer-readable storage medium may also include any volatile or non-volatile media such as RAM (e.g., SDRAM, DDR SDRAM, RDRAM, SRAM, etc.), ROM, etc., that may be included in some embodiments of computer system 1200 as system memory 1220 or another type of memory. In other embodiments, program instructions may be communicated using optical, acoustical or other form of propagated signal (e.g., carrier waves, infrared signals, digital signals, etc.) conveyed via a communication medium such as a network and/or a wireless link, such as may be implemented via network interface 1240.

In some embodiments, system memory 1220 may include data store 1235, which may be configured as described herein. In general, system memory 1220 (e.g., data store 1235 within system memory 1220), persistent storage, and/or remote storage may store data blocks, replicas of data blocks, metadata associated with data blocks and/or their state, configuration information, and/or any other information usable in implementing the methods and techniques described herein.

In one embodiment, I/O interface 1230 may be configured to coordinate I/O traffic between processor(s) 1210, system memory 1220 and any peripheral devices in the system, including through network interface 1240 or other peripheral interfaces. In some embodiments, I/O interface 1230 may perform any necessary protocol, timing or other data transformations to convert data signals from one component (e.g., system memory 1220) into a format suitable for use by another component (e.g., processor(s) 1210). In some embodiments, I/O interface 1230 may include support for devices attached through various types of peripheral buses, such as a variant of the Peripheral Component Interconnect (PCI) bus standard or the Universal Serial Bus (USB) standard, for example. In some embodiments, the function of I/O interface 1230 may be split into two or more separate components, such as a north bridge and a south bridge, for example. Also, in some embodiments, some or all of the functionality of I/O interface 1230, such as an interface to system memory 1220, may be incorporated directly into processor(s) 1210.

Network interface 1240 may be configured to allow data to be exchanged between computer system 1200 and other devices attached to a network, such as other computer systems (which may implement one or more virtual computing instances, ephemeral computing resources, storage system resource hosts, database engine head nodes or resource hosts, and/or clients of the systems described herein), for example. In addition, network interface 1240 may be configured to allow communication between computer system 1200 and various I/O devices 1250 and/or remote storage. Input/output devices 1250 may, in some embodiments, include one or more display terminals, keyboards, keypads, touchpads, scanning devices, voice or optical recognition devices, or any other devices suitable for entering or retrieving data by one or more computer systems 1200. Multiple input/output devices 1250 may be present in computer system 1200 or may be distributed on various nodes of a distributed system that includes computer system 1200. In some embodiments, similar input/output devices may be separate from computer system 1200 and may interact with one or more nodes of a distributed system that includes computer system 1200 through a wired or wireless connection, such as over network interface 1240. Network interface 1240 may commonly support one or more wireless networking protocols (e.g., Wi-Fi/IEEE 802.11, or another wireless networking standard). However, in various embodiments, network interface 1240 may support communication via any suitable wired or wireless general data networks, such as other types of Ethernet networks, for example. Additionally, network interface 1240 may support communication via telecommunications/telephony networks such as analog voice networks or digital fiber communications networks, via storage area networks such as Fibre Channel SANs, or via any other suitable type of network and/or protocol. In various embodiments, computer system 1200 may include more, fewer, or different components than those illustrated (e.g., displays, video cards, audio cards, peripheral devices, other network interfaces such as an ATM interface, an Ethernet interface, a Frame Relay interface, etc.)

It is noted that any of the distributed system embodiments described herein, or any of their components, may be implemented as one or more network-based services. For example, a compute cluster within a computing service may present computing services and/or other types of services that employ the distributed computing systems described herein to clients as network-based services. In some embodiments, a network-based service may be implemented by a software and/or hardware system designed to support interoperable machine-to-machine interaction over a network. A network-based service may have an interface described in a machine-processable format, such as the Web Services Description Language (WSDL). Other systems may interact with the network-based service in a manner prescribed by the description of the network-based service's interface. For example, the network-based service may define various operations that other systems may invoke, and may define a particular application programming interface (API) to which other systems may be expected to conform when requesting the various operations.

In various embodiments, a network-based service may be requested or invoked through the use of a message that includes parameters and/or data associated with the network-based services request. Such a message may be formatted according to a particular markup language such as Extensible Markup Language (XML), and/or may be encapsulated using a protocol such as Simple Object Access Protocol (SOAP). To perform a network-based services request, a network-based services client may assemble a message including the request and convey the message to an addressable endpoint (e.g., a Uniform Resource Locator (URL)) corresponding to the network-based service, using an Internet-based application layer transfer protocol such as Hypertext Transfer Protocol (HTTP).

In some embodiments, network-based services may be implemented using Representational State Transfer ("RESTful") techniques rather than message-based techniques. For example, a network-based service implemented according to a RESTful technique may be invoked through parameters included within an HTTP method such as PUT, GET, or DELETE, rather than encapsulated within a SOAP message.

Although the embodiments above have been described in considerable detail, numerous variations and modifications may be made as would become apparent to those skilled in the art once the above disclosure is fully appreciated. It is intended that the following claims be interpreted to embrace all such modifications and changes and, accordingly, the above description to be regarded in an illustrative rather than a restrictive sense.

What is claimed is:

1. A system, comprising:
    a plurality of data storage devices; and
    one or more computing devices configured to implement a data storage service comprising:
        an interface configured to receive data to be stored in one or more of the data storage devices; and
        a registry of data compression operators;
        a configurable data compressor, comprising:
            a compressor configuration engine configured to:
                receive or determine a first recipe for a first configuration of the configurable data compressor to be used to compress a first data set;
                assemble a first compression pipeline comprising respective ones of the data compression operators of the registry arranged in a first configuration specified in the first recipe for the first data set; and
            a compressor runtime configured to:
                compress the first data set using the configurable data compressor configured in the first configuration;
        wherein the compressor configuration engine is further configured to:
            receive or determine a second recipe for a second configuration of the configurable data compressor to be used to compress a second data set;
            assemble a second compression pipeline comprising respective ones of the data compression operators of the registry arranged in a second configuration specified in the second recipe for the second data set, and
        wherein the compressor runtime is further configured to:
            compress the second data set using the configurable data compressor configured in the second configuration.

2. The system of claim 1, wherein the data storage service further comprises:
    a configurable data de-compressor, comprising:
        a decompressor configuration engine configured to:
            receive or determine the first recipe;
            assemble a first de-compression pipeline comprising respective ones of the data compression operators of the registry arranged in a first configuration specified in the first recipe; and
        a decompressor runtime configured to:
            decompress a compressed version of the first data set using the configurable data decompressor configured in the first configuration;

wherein the decompressor configuration engine is further configured to:
   receive or determine the second recipe;
   assemble a second de-compression pipeline comprising respective ones of the data compression operators of the registry arranged in a second configuration specified in the second recipe; and
wherein the decompressor runtime is further configured to:
   decompress a compressed version of the second data set using the configurable data decompressor configured in the second configuration.

3. The system of claim 1, wherein the compression operators of the registry comprise two or more of:
   a data parser;
   a data queue;
   a first type of data encoder;
   one or more additional types of data encoders;
   a compression transform; or
   a compression contextual information sharing connector.

4. The system of claim 1, wherein the first data set or the second data set comprise:
   log data; or
   genomic data.

5. The system of claim 1, wherein the data storage service, further comprises:
   a recipe generation module configured to:
      receive training data for a plurality of types of data sets;
      for respective ones of the types of data sets:
         generate a graph for processing a given type of data set, wherein the graph comprises a plurality of ones of the data compression operators at respective ones of the nodes of the graph;
         compress the training data a first time use a first set of the respective data compression operators of the respective ones of the nodes of the graph;
         compress the training data one or more additional times using one or more additional sets of the respective data compression operators of the respective ones of the nodes of the graph; and
         determine a recipe for the given type of data set based on performance of the respective data compression operators when compressing the training data the first time and the one or more additional times; and
      provide information indicating respective ones of the determined recipes to be used for respective ones of the plurality of types of data sets.

6. The system of claim 1, wherein the data storage service, further comprises:
   a recipe generation module configured to:
      sample respective blocks of the first data set or the second data set;
      generate a graph for processing the respective blocks of the first or second data set, wherein the graph comprises a plurality of ones of the data compression operators at respective ones of the nodes of the graph;
      compress a first block using a first set of the respective data compression operators of the respective ones of the nodes of the graph;
      compress one or more additional ones of the blocks using one or more additional sets of the respective data compression operators of the respective ones of the nodes of the graph; and
      for subsequent ones of the blocks, select a set of the respective data compression operators to use to compress the subsequent ones of the blocks based on performance measures of the data compression operators for preceding ones of the blocks.

7. The system of claim 6, wherein the recipe generation module is further configured to:
   determine a type of data for the first or second data set and reduce the plurality of data compression operators included at the respective ones of the nodes of the graph to include a reduced set of compression operators customized for the determined data type of the first or second data set.

8. One or more non-transitory, computer-readable, storage media, storing program instructions that, when executed on or across one or more processors, cause the one or more processors to:
   receive a first data set;
   receive or determine a first recipe for a first configuration of a configurable data compressor to be used to compress the first data set;
   assemble a first compression pipeline comprising respective ones of a plurality of data compression operators arranged in a first configuration specified in the first recipe;
   compress the first data set using the configurable data compressor configured in the first configuration;
   receive a second data set;
   receive or determine a second recipe for a second configuration of the configurable data compressor to be used to compress the second data set;
   assemble a second compression pipeline comprising respective ones of the plurality of data compression operators arranged in a second configuration specified in the second recipe; and
   compress the second data set using the configurable data compressor configured in the second configuration.

9. The one or more non-transitory, computer-readable, storage media of claim 8, wherein the program instruction, when executed on or across the one or more processors, further cause the one or more processors to:
   provide a compressed version of the first data set comprising compressed data and an indicator of the compression operators used in the first compression pipeline;
   provide a compressed version of the second data set comprising compressed data and an indicator of the compression operators used in the second compression pipeline.

10. The one or more non-transitory, computer-readable, storage media of claim 8, wherein the plurality of data compression operators are stored in a registry accessible by the one or more processors, wherein the plurality of data compression operators included in the registry comprises two or more of:
   a data parser;
   a data queue;
   a first type of data encoder;
   one or more additional types of data encoders;
   a compression transform; or
   a compression contextual information sharing connector.

11. The one or more non-transitory, computer-readable, storage media of claim 8, wherein:
   the first or second data set comprises log data.

12. The one or more non-transitory, computer-readable, storage media of claim 8, wherein the first and second data sets comprise two or more of:
   text data;
   image data;

video data;
audio data; or
genomic data.

13. The one or more non-transitory, computer-readable, storage media of claim 8, wherein the program instruction, when executed on or across the one or more processors, further cause the one or more processors to:
receive one or more constraints for compression of the first data set or the second data set; and/or
receive one or more compression priorities for compression of the first data set or the second data set; and
solve a graph optimization problem for the first or second data set to determine the first or second recipe, wherein the graph optimization problem is solved using the one or more constraints and/or the one or more compression priorities.

14. The one or more non-transitory, computer-readable, storage media of claim 8, wherein the program instruction, when executed on or across the one or more processors, further cause the one or more processors to:
receive training data for a plurality of types of data sets;
for respective ones of the types of data sets:
generate a graph for processing a given type of data set, wherein the graph comprises a plurality of ones of the data compression operators at respective ones of the nodes of the graph;
compress the training data a first time use a first set of the respective data compression operators of the respective ones of the nodes of the graph;
compress the training data one or more additional times using one or more additional sets of the respective data compression operators of the respective ones of the nodes of the graph; and
determine a recipe for the given type of data set based on performance of the respective data compression operators when compressing the training data the first time and the one or more additional times; and
provide information indicating respective ones of the determined recipes to be used for respective ones of the plurality of types of data sets.

15. The one or more non-transitory, computer-readable, storage media of claim 8, wherein the program instruction, when executed on or across the one or more processors, further cause the one or more processors to:
sample respective blocks of the first data set or the second data set;
generate a graph for processing the respective blocks of the first or second data set, wherein the graph comprises a plurality of ones of the data compression operators at respective ones of the nodes of the graph;
compress a first block using a first set of the respective data compression operators of the respective ones of the nodes of the graph;
compress one or more additional ones of the blocks using one or more additional sets of the respective data compression operators of the respective ones of the nodes of the graph; and
for subsequent ones of the blocks, select a set of the respective data compression operators to use to compress the subsequent ones of the blocks based on performance measures of the data compression operators for preceding ones of the blocks.

16. The one or more non-transitory, computer-readable, storage media of claim 15, wherein the program instruction, when executed on or across the one or more processors, further cause the one or more processors to:
determine a type of data for the first or second data set and reduce the plurality of data compression operators included at the respective ones of the nodes of the graph to include a reduced set of compression operators customized for the determined data type of the first or second data set.

17. A method, comprising:
receiving a first data set;
receiving or determining a first recipe for a first configuration of a configurable data compressor to be used to compress the first data set;
assembling a first compression pipeline comprising respective ones of a plurality of data compression operators arranged in a first configuration specified in the first recipe;
compressing the first data set using the configurable data compressor configured in the first configuration;
receiving a second data set;
receiving or determining a second recipe for a second configuration of the configurable data compressor to be used to compress the second data set;
assembling a second compression pipeline comprising respective ones of the plurality of data compression operators arranged in a second configuration specified in the second recipe; and
compressing the second data set using the configurable data compressor configured in the second configuration.

18. The method of claim 17, wherein the first or second compression pipeline includes a plurality of parallel branches, and wherein compressing the first or second data set comprises using a plurality of processing thread to compress the parallel branches in parallel.

19. The method of claim 17, further comprising:
receiving training data for a plurality of types of data sets;
for respective ones of the types of data sets:
generating a graph for processing a given type of data set, wherein the graph comprises a plurality of ones of the data compression operators at respective ones of the nodes of the graph;
compressing the training data a first time use a first set of the respective data compression operators of the respective ones of the nodes of the graph;
compressing the training data one or more additional times using one or more additional sets of the respective data compression operators of the respective ones of the nodes of the graph; and
determining a recipe for the given type of data set based on performance of the respective data compression operators when compressing the training data the first time and the one or more additional times; and
providing information indicating respective ones of the determined recipes to be used for respective ones of the plurality of types of data sets.

20. The method of claim 17, further comprising:
sampling respective blocks of the first data set or the second data set;
generating a graph for processing the respective blocks of the first or second data set, wherein the graph comprises a plurality of ones of the data compression operators at respective ones of the nodes of the graph;
compressing a first block using a first set of the respective data compression operators of the respective ones of the nodes of the graph;

compressing one or more additional ones of the blocks using one or more additional sets of the respective data compression operators of the respective ones of the nodes of the graph; and for subsequent ones of the blocks, selecting a set of the respective data compression operators to use to compress the subsequent ones of the blocks based on performance measures of the data compression operators for preceding ones of the blocks.

\* \* \* \* \*